United States Patent
Marzaki

(10) Patent No.: US 10,943,973 B2
(45) Date of Patent: Mar. 9, 2021

(54) INTEGRATED CIRCUIT COMPRISING LOW VOLTAGE CAPACITIVE ELEMENTS

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/400,286

(22) Filed: May 1, 2019

(65) Prior Publication Data

US 2019/0341446 A1    Nov. 7, 2019

(30) Foreign Application Priority Data

May 2, 2018 (FR) ..................................... 1853778

(51) Int. Cl.
| | |
|---|---|
| *H01L 27/115* | (2017.01) |
| *H01L 27/06* | (2006.01) |
| *H01L 27/07* | (2006.01) |
| *H01L 27/08* | (2006.01) |
| *H01L 27/10* | (2006.01) |
| *H01L 29/06* | (2006.01) |

(Continued)

(52) U.S. Cl.
CPC ........ *H01L 28/60* (2013.01); *H01L 27/11517* (2013.01); *H01L 29/0649* (2013.01); *H01L 27/0629* (2013.01); *H01L 27/0733* (2013.01); *H01L 27/0805* (2013.01); *H01L 27/101* (2013.01)

(58) Field of Classification Search
CPC ............... H01L 28/60; H01L 27/11517; H01L 27/0629; H01L 27/0733; H01L 27/0805; H01L 27/101; H01L 29/0649
See application file for complete search history.

(56) References Cited

U.S. PATENT DOCUMENTS 4,914,546 A * 4/1990 Alter .................... H01L 27/0805
                                                        257/306
5,851,868 A * 12/1998 Kim ....................... H01L 23/642
                                                        438/238

(Continued)

FOREIGN PATENT DOCUMENTS

JP      2009065031 A      3/2009

OTHER PUBLICATIONS

INPI Search Report and Written Opinion for FR 1853778 dated Jan. 11, 2019 (15 pages).

*Primary Examiner* — Ida M Soward
(74) *Attorney, Agent, or Firm* — Crowe & Dunlevy

(57) ABSTRACT

A capacitive element of an integrated circuit includes first and second electrodes. The first electrode is formed by a first electrically conductive layer located above a semiconductor well doped with a first conductivity type. The second electrode is formed by a second electrically conductive layer located above the first electrically conductive layer of the semiconductor well. The second electrode is further formed by a doped surface region within the semiconductor well that is heavily doped with a second conductivity type opposite the first conductivity type, wherein the doped surface region is located under the first electrically conductive layer. An inter-electrode dielectric area electrically separates the first electrode and the second electrode.

18 Claims, 3 Drawing Sheets

(51) Int. Cl.
*H01L 49/02* (2006.01)
*H01L 27/11517* (2017.01)

(56) References Cited

U.S. PATENT DOCUMENTS

| | | | | |
|---|---|---|---|---|
| 6,177,298 | B1 * | 1/2001 | Quigley | H01L 27/0251 438/135 |
| 6,365,954 | B1 * | 4/2002 | Dasgupta | H01L 27/0805 257/307 |
| 6,693,316 | B2 * | 2/2004 | Tanaka | H01L 27/0222 257/299 |
| RE39,124 | E * | 6/2006 | Ehben | H01L 23/5222 257/532 |
| 7,176,546 | B2 * | 2/2007 | Ahrens | H01L 27/0676 257/458 |
| 7,239,005 | B2 * | 7/2007 | Sekimoto | H01L 27/0629 257/306 |
| 7,361,950 | B2 * | 4/2008 | Chinthakindi | H01L 28/40 257/301 |
| 8,344,391 | B2 * | 1/2013 | Fornara | G11C 17/16 257/79 |
| 8,575,720 | B2 * | 11/2013 | Leonardi | H01L 27/12 257/531 |
| 8,674,352 | B2 * | 3/2014 | Soundarapandian | H01L 21/761 257/43 |
| 8,753,952 | B2 * | 6/2014 | Summerfelt | H01L 28/55 438/396 |
| 9,159,723 | B2 * | 10/2015 | Chou | H01L 27/0805 |
| 9,178,080 | B2 * | 11/2015 | Kalnitsky | H01L 29/945 |
| 9,196,672 | B2 * | 11/2015 | Tran | |
| 9,954,121 | B2 * | 4/2018 | Cheng | H01L 31/0352 |
| 9,978,829 | B2 * | 5/2018 | Lin | H01L 29/945 |
| 10,128,303 | B2 * | 11/2018 | Cheng | H01L 31/028 |
| 10,734,533 | B2 * | 8/2020 | Cheng | H01L 31/02005 |
| 2003/0057510 | A1 | 3/2003 | Ishii | |
| 2007/0069269 | A1 * | 3/2007 | Balster | H01L 27/0629 257/303 |
| 2007/0145528 | A1 * | 6/2007 | Fischer | G06K 19/0723 257/532 |
| 2011/0086487 | A1 * | 4/2011 | Baumgartner | H01L 27/0688 438/381 |
| 2012/0034751 | A1 * | 2/2012 | Ariyoshi | H01L 21/823857 438/381 |
| 2014/0034999 | A1 | 2/2014 | Korec | |
| 2014/0225225 | A1 * | 8/2014 | Chung | H01L 27/108 257/532 |
| 2017/0229446 | A1 * | 8/2017 | Fukasaku | H01L 27/0285 |
| 2018/0175168 | A1 * | 6/2018 | Su | H01L 21/743 |

* cited by examiner

INTEGRATED CIRCUIT COMPRISING LOW VOLTAGE CAPACITIVE ELEMENTS

PRIORITY CLAIM

This application claims the priority benefit of French Application for Patent No. 1853778, filed on May 2, 2018, the content of which is hereby incorporated by reference in its entirety to the maximum extent allowable by law.

TECHNICAL FIELD

The embodiments and the implementation of the invention relate to integrated circuits, particularly low-voltage capacitive elements.

BACKGROUND

Indeed, analog parts and parts intended to process radiofrequency signals of integrated circuits particularly require capacitors with a linear capacitive value for low voltages, typically for voltages close to 0 V at their terminals.

For example, between 0.0 V and 0.5 V a variation of less than 10% to 15% of the capacitive value is considered to be acceptable.

Typically, such capacitors have been produced by interfaces of two layers of conductive material separated by a dielectric layer, for example, of the MOM (Metal-Oxide-Metal) type.

However, the capacitors that are produced according to this approach (of the MOM type) have a relatively low capacitive value per unit area, for example, of approximately 3 fF/$\mu m^2$, and can represent 10% of the bulk of an analog part of an integrated circuit, and 50% of the bulk of a part intended to process radiofrequency signals of an integrated circuit.

The conventional technologies for capacitors of the MOS (Metal-Oxide-Silicon) type offer better performance in terms of surface capacitive value but worse performance in terms of low-voltage variations.

Consequently, it is worthwhile increasing the surface capacitive value of integrated circuit capacitors while maintaining an acceptable variation of this low-voltage value.

SUMMARY

To this end, according to one aspect, an integrated circuit is proposed comprising a semiconductor well with a first conductivity type and at least one capacitive element comprising: a first electrode comprising a first electrically conductive layer located above the semiconductor well with a first conductivity type; a second electrode comprising a second electrically conductive layer above the first layer, a doped surface region heavily doped with a second conductivity type that is opposite the first conductivity type located in the well and on the surface of the well and under the first layer; and an inter-electrode dielectric area separating the first electrode and the second electrode.

The doped surface region heavily doped with a second conductivity type that is opposite the first conductivity type of the well, located on the surface of the well, forms a local area with a high density of minority carriers, allowing linear operation by inversion (i.e., having limited variations of the capacitive value) and introducing an increase of the surface capacitive value by inversion. The capacitive element also exhibits good accumulation performance.

For example, the surface capacitive value of a capacitive element according to this aspect can be approximately 9 fF/$\mu m^2$.

According to one embodiment, the doped surface region extends over the surface of the well facing the whole of the first layer.

Indeed, the presence of the doped surface region over the whole of the surface of the well at the interface of the second electrode and the first electrode allows the linearity of the low-voltage capacitive value to be improved.

For example, the thickness of said doped surface region is less than 10 nm, preferably less than 5 nm.

According to one embodiment, the dielectric area comprises a first dielectric layer, for example, a tunnel oxide, between the first conductive layer and the doped surface region, and a second dielectric layer, for example, a gate oxide, between the first conductive layer and the second conductive layer.

According to one embodiment, the capacitive element comprises a first contact heavily doped with the first conductivity type electrically connecting the well to the second electrode, and a second contact heavily doped with the second conductivity type electrically connecting the doped surface region to the second electrode.

Thus, with the second electrode being electrically connected to the well and comprising the second electrically conductive layer, the surface of the interfaces between the first and the second electrode is located on either side of the first conductive layer. This allows the surface capacitive value to be doubled compared to a conventional configuration.

According to one embodiment, the integrated circuit comprises a decoupling capacitor and/or a compensation circuit and/or a radiofrequency signal reception line filter, respectively incorporating said at least one capacitive element.

According to another aspect, a manufacturing method is proposed for a capacitive element comprising: forming a first electrode that comprises forming a first electrically conductive layer on a semiconductor substrate with a first conductivity type, forming a second electrode that comprises forming a second electrically conductive layer on the first layer and installing a doped surface region heavily doped with a second conductivity type that is opposite the first conductivity type under the first layer and on the surface of the well and forming an inter-electrode dielectric area electrically separating the first electrode and the second electrode.

According to one embodiment, the installation of the doped surface region is carried out over the entire surface of the well facing the first layer.

According to one embodiment, the installation of the doped surface region is configured to form said doped surface region, the thickness of which is less than 10 nm, preferably less than 5 nm.

According to one embodiment, the installation of the doped surface region is carried out with 20 keV of energy and a surface concentration of $3.0*10^{13}$ $cm^{-2}$.

According to one embodiment, the formation of the dielectric area comprises forming a first dielectric layer between the first conductive layer and the doped surface region and forming a second dielectric layer between the first conductive layer and the second conductive layer.

According to one embodiment, the method comprises forming a first contact heavily doped with the first conductivity type to electrically connect the well to the second electrode, and a second contact heavily doped with the second conductivity type to electrically connect the doped surface region to the second electrode.

According to one embodiment, said formation of a first electrically conductive layer is part of a step further and commonly comprising forming a floating gate of a floating gate transistor, said formation of a second electrically conductive layer is part of a step further and commonly comprising forming a floating gate transistor control gate, said installation of a doped surface region is part of a step further and commonly comprising a counteractive-installation in a channel area of the floating gate transistor, and said formation of an inter-electrode dielectric area is part of steps further and commonly comprising forming dielectric layers of the floating gate transistor.

Thus, the manufacture of the capacitive element according to this embodiment is completely free in a technological chain providing for the implementation of the aforementioned steps for manufacturing a floating gate transistor.

BRIEF DESCRIPTION OF THE DRAWINGS

Further advantages and features of the invention will become apparent upon reading the detailed description of embodiments and of the implementation of the invention, which are by no means limiting, and with reference to the accompanying drawings, in which.

DETAILED DESCRIPTION

Figure 1:
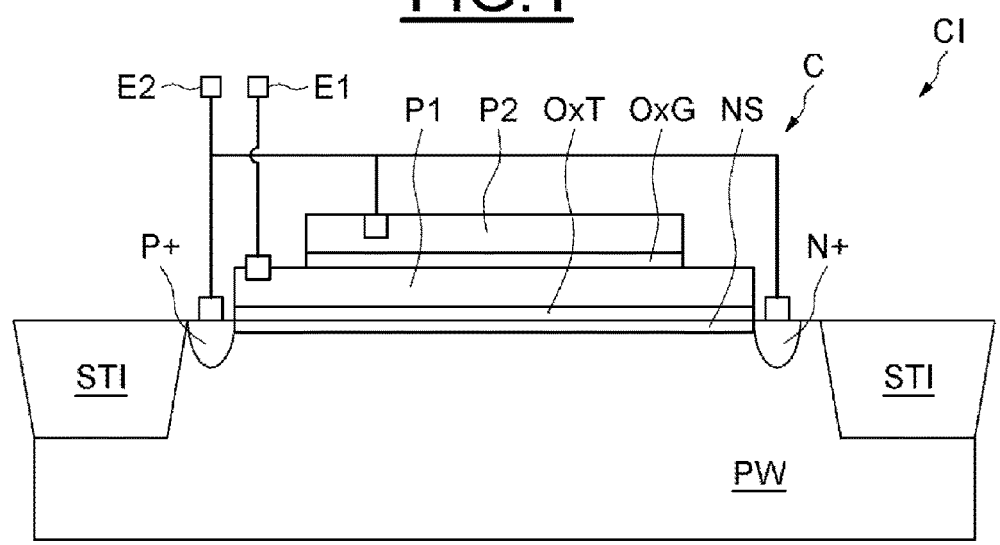
FIG. 1 is a cross-section view of a capacitive element of an integrated circuit.

FIG. 1 is a cross-section view of a capacitive element C of an integrated circuit CI comprising a first electrode E1 and a second electrode E2 electrically separated by an inter-electrode dielectric located between them.

The capacitive element C is located on a semiconductor well PW with a first conductivity type, more specifically, on an area, called active area, of the well PW, i.e. a part that is not covered by lateral isolation areas STI.

In this case, the well PW is part of an upper part of an underlying semiconductor substrate, but clearly can be an isolated well, of the "triple well" type.

For example, the first conductivity type is the P-type, and thus, a second conductivity type that is opposite the first conductivity type is the N-type. The opposite also can be contemplated.

The lateral isolation areas STI, for example, of the shallow trench isolation type, allow active areas neighboring the well PW to be electrically isolated.

The first electrode E1 comprises a first electrically conductive layer P1, for example, made of doped polycrystalline silicon, which covers most of the surface of the active area (i.e., for example, the whole of the surface except the first and second contacts P+, N+ mentioned hereafter).

A first dielectric layer OxT separates the surface of the active area from the first layer P1. For example, the first dielectric layer OxT is a silicon oxide of the tunnel oxide type that is approximately 7 nm thick.

The second electrode E2 comprises a second electrically conductive layer P2, for example, made of doped polycrystalline silicon, located above the first layer P1.

A second dielectric layer OxG separates the first layer P1 and the second layer P2. For example, the second dielectric layer OxG is a high-voltage gate oxide, of the silicon oxide-nitride-oxide stack type (commonly denoted "ONO").

The second electrode E2 further comprises a doped surface region NS on the surface of the well PW.

According to one embodiment, the well PW is electrically connected to the second electrode E2 via a first contact P+ heavily doped with the first conductivity type. In this context, "heavily doped" means doped with a dopant level at/cm$^3$ that would allow for a low resistance ohmic coupling to exist.

The doped surface region NS is heavily doped with a second conductivity type that is opposite the first conductivity type and is located in the well PW and on its surface, under the first layer P1.

Given the opposing conductivities of the dopants of the substrate PW and of the doped surface region NS, the doped surface region NS is called "counteractively-installed".

The counteractively-installed doped surface region NS advantageously extends over the surface of the well PW that is located facing the whole of the first layer P1.

Indeed, if the doped surface region extends over the whole of the part of the well PW at the interface of the second electrode E2 with the first electrode E1, the capacitive value of the capacitive element C is more stable (linear) for voltages close to 0 V (voltages between the two electrodes of the capacitive element C).

According to a particular embodiment, the capacitive element C does not comprise a trench extending vertically in the well PW and comprising a central conductive portion surrounded by an isolating envelope and electrically coupled to the first electrode E1.

Thus, as it is not "cut" by trenches, the counteractively-installed doped surface region NS extends over the surface of the well PW facing the whole of the first layer P1.

With the surface of the well PW that provides the interface for the second electrode E2 with the first electrode E1 thus being fully covered by the doped surface region, the capacitive value of the capacitive element C advantageously is linear at voltages close to 0 V.

The shallower the depth of the counteractively-installed doped surface region NS, the more the addition of minority carriers will be located close to the interface between the well PW and the first dielectric layer OxT. This provides better performance.

For example, the depth of the counteractively-installed doped surface region NS is less than 10 nm, preferably less than 5 nm.

The counteractively-installed doped surface region NS is electrically connected to the second electrode E2 via a second contact N+ heavily doped with the second conductivity type, allowing low resistance ohmic coupling with said doped surface region NS.

Thus, when biasing the electrodes of the capacitive element C in an accumulation regime, the well PW is biased to the voltage of the second electrode E2 via the first contact P+ and, when biasing the electrodes of the capacitive element C in an inversion regime, the doped surface region NS is biased to the voltage of the second electrode E2 via the second contact N+.

Figure 2:
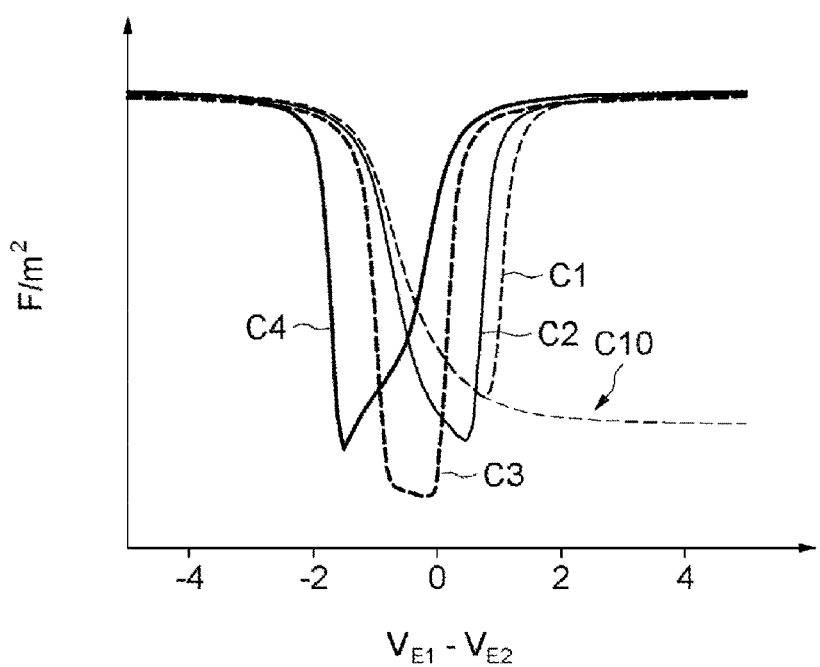
FIG. 2 shows examples of features of the capacitive element.

FIG. 2 shows examples of features of embodiments of the capacitive element C.

The features shown are the surface capacitive value $F/m^2$ as a function of the voltage $V_{E1}$-$V_{E2}$ on the terminals of the capacitive element C for various minority carrier concentrations of the counteractively-installed doped surface region NS.

These results correspond to counteractive-installations of N-type dopants, such as arsenic, in a P-type silicon substrate, in order to form said doped surface region NS.

The surface capacitive values $F/m^2$ are shown on a scale ranging from 5 $fF/\mu m^2$ to 9 $fF/\mu m^2$ (femtofarad per micrometer squared) for voltages $V_{E1}$-$V_{E2}$ on the terminals of the capacitive element C that are between −4V and +4V.

The curve C1 corresponds to a capacitive element not comprising a counteractively-installed doped surface region.

The curve C2 corresponds to a capacitive element comprising a counteractively-installed doped surface region NS with a surface concentration of $1.0*10^{13}$ $cm^{-2}$.

The curve C3 corresponds to a capacitive element comprising a counteractively-installed doped surface region NS with a surface concentration of $2.0*10^{13}$ $cm^{-2}$.

The curve C4 corresponds to a capacitive element comprising a counteractively-installed doped surface region NS with a surface concentration of $3.0*10^{13}$ $cm^{-2}$.

The features shown by the four curves C1-C4 each comprise two stable regimes, called accumulation regime Acc for substantially negative voltages and inversion regime Inv for substantially positive voltages, as well as a transitory regime Trs between said accumulation and inversion regimes for voltages close to 0 V.

The surface capacitive values in accumulation and inversion regimes are substantially constant and equal and the transitory regime has an acute hollow (i.e. a negative spike) between the two stable regimes.

For each feature C1-C4, the minimum capacitive value (i.e. in the hollow of the negative spike) is reached at the threshold voltage of the corresponding capacitive element.

It is to be noted that the curve C1, even though it represents a structure that does not comprise a counteractively-installed doped surface region, corresponds, according to this feature, to a structure comprising a source of minority carriers such as the second contact N+ only. In the absence of a source of minority carriers such as the second contact N+ only, the capacitive value in the inversion regime exhibits the profile of the curve C10, i.e. a high stable value in the accumulation regime and a low stable value, less than the high stable value, in the inversion regime, according to a plot line exhibiting the profile of an arc-cotangent function.

For example, the capacitive value of the stable regimes Acc, Inv is approximately 9 $fF/\mu m^2$ and the hollow of the transitory regime Trs drops to substantially 6 $fF/\mu m^2$ to 5.5 $fF/\mu m^2$ at the respective threshold voltage.

The curves C1-C4 of FIG. 2 show that the effect of the counteractive-installation of the doped surface region NS is to reduce the value of the threshold voltage, proportionally to the surface concentration of said doped surface region NS.

The reduction in the value of the threshold voltage is accompanied by a leftwards translation movement (in the orientation of FIG. 2) of the whole of the considered curve.

Thus, when the threshold voltage of a capacitive element not comprising a counteractively-installed doped surface region (curve C1) is approximately +0.7 V, the threshold voltage of a capacitive element comprising a counteractively-installed doped surface region NS with a high surface concentration (curve C4) is approximately −1.6 V.

Furthermore, reducing the threshold voltage allows the transitory regime to be shifted towards negative voltages (in this case, for the curve C4, between −2 V and 0 V) and thus allows a stable capacitive value to be obtained in the inversion regime at positive voltages close to 0 V.

Indeed, according to embodiments (for example, as characterized by the curve C4), the capacitive value variation does not exceed 5% of the stable value between 0 V and 0.5 V and does not exceed 10% of the stable value between 0 V and 4 V.

Figure 3:
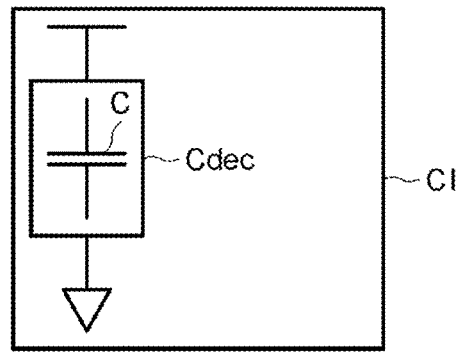
FIG. 3 shows an embodiment comprising a decoupling capacitor.

FIG. 3 shows an embodiment in which the integrated circuit CI comprises a decoupling capacitor Cdec, for example, connected between a supply terminal and a ground terminal of a component of the integrated circuit CI.

Thus, the capacitive element C can belong to the decoupling capacitor Cdec, particularly by virtue of its performance in terms of surface capacitive value and ubiquity.

Indeed, the decoupling capacitor Cdec can comprise, for example, multiple embodiments of similar capacitive elements C at different points of the integrated circuit CI, coupled in parallel in order to obtain a desired capacitive value for the decoupling capacitor Cdec.

Figure 4:
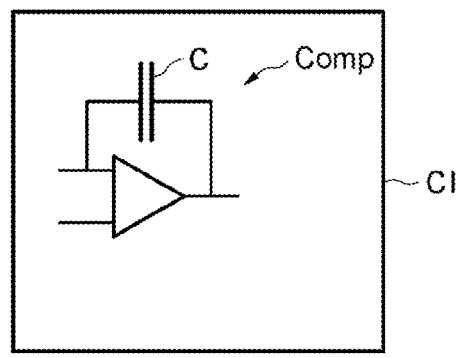
FIG. 4 shows an embodiment comprising a compensation circuit.

FIG. 4 shows an embodiment in which the integrated circuit CI comprises a compensation circuit Comp, for example, such as a feedback filtered by the capacitive effect of an output value over an input value.

Thus, the capacitive element C can belong to a compensation circuit Comp applied to radiofrequency signals, particularly by virtue of its performance in terms of linearity at low voltages.

Figure 5:
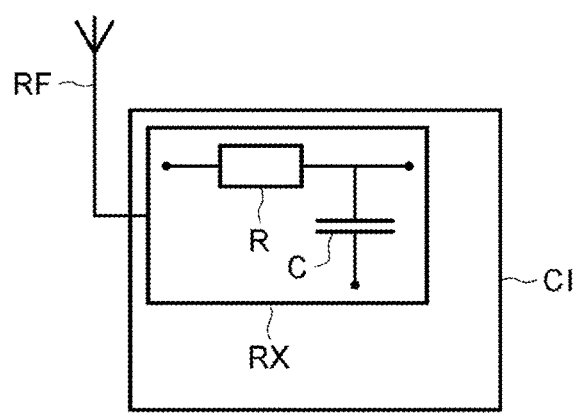
FIG. 5 shows an embodiment comprising a capacitor for a radiofrequency signal filter assembly.

FIG. 5 shows an embodiment in which the integrated circuit CI comprises a radiofrequency signal RF reception line RX, comprising a filter assembly, for example, a filter RC comprising a resistive element R and a capacitive element C.

Thus, the capacitive element C can belong to the filter RC of the radiofrequency signal RF reception line RX, particularly by virtue of its performance in terms of surface capacitive value and in terms of linearity at low voltages.

Figure 6:
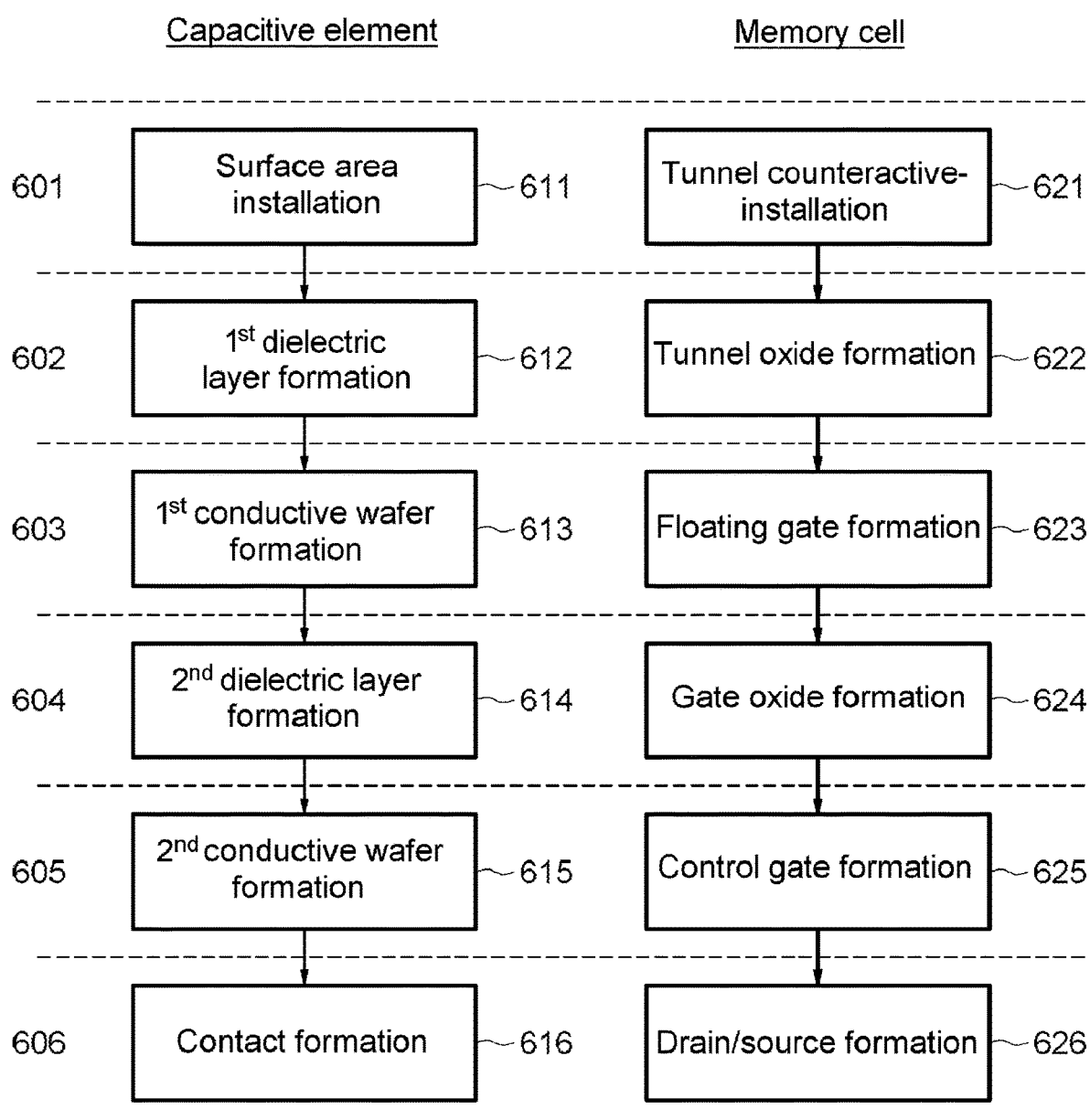
FIG. 6 represents an implementation of a manufacturing method according to the invention.

FIG. 6 shows an embodiment of a method for manufacturing a capacitive element C, on the one hand, and a memory cell, on the other hand.

Indeed, the steps of manufacturing the capacitive element C can be included in manufacturing steps provided for a memory cell comprising a floating gate transistor.

According to one embodiment, the method for manufacturing a capacitive element C comprises forming a first electrode, forming a second electrode and forming an inter-electrode dielectric area electrically separating the first electrode and the second electrode.

The forming of the first electrode, the second electrode and the inter-electrode dielectric area are not implemented as such one after the other, but clearly comprise intricate manufacturing sub-steps and progressively result in the production of said electrodes, separated by an inter-electrode dielectric area.

An embodiment of the formation of the first electrode comprises forming a first electrically conductive layer 613 on a semiconductor well with a first conductivity type.

An embodiment of the formation of the second electrode comprises forming a second electrically conductive layer 615 on the first layer and installing 611 a doped surface region heavily doped with a second conductivity type that is opposite the first conductivity type under the first layer and on the surface of the well.

An embodiment of the formation of an inter-electrode dielectric area 612, 614 comprises forming a first dielectric layer 612 between the first conductive layer and the doped surface region and forming a second dielectric layer 614 between the first conductive layer and the second conductive layer.

An embodiment of the method further comprises forming 616 a first contact heavily doped with the first conductivity type intended to electrically connect the well to the second electrode and a second contact heavily doped with the second conductivity type intended to electrically connect the doped surface region to the second electrode.

These sub-steps are executed, for example, in the order shown in FIG. 6, according to an embodiment that is advantageously adapted for an integrated circuit comprising a non-volatile memory.

During a first step 601, the installation of a doped surface region 611 is implemented in a well of the substrate that is intended to receive the capacitive element C.

During the first step 601, a counteractive-installation 621 in the vicinity of the channel area of the future floating gate transistor is also implemented at the same time in another well intended to receive a non-volatile memory cell comprising a floating gate transistor.

The installation of the doped surface region 611 and the counteractive-installation 621 of the channel area have exactly the same features. For example, the counteractive-installations 611, 621 are produced with 20 keV of energy and a surface concentration of $3.0*10^{13}$ cm$^{-2}$, and are configured to form a doped surface region that is less than 10 nm thick, preferably less than 5 nm thick.

Furthermore, according to one embodiment, said installation of the doped surface region 611 is performed over the whole of the surface of the well located facing the future first electrically conductive layer.

Thus, only the mask from which the counteractive-installation 621 of the memory cell is produced has to be adapted to implement the installation of the doped surface region 611 of the capacitive element during the first common step 601.

During a second step 602, the formation of the first dielectric layer 612 of the capacitive element is simultaneously implemented with the formation of a dielectric tunnel 622 of a memory cell floating gate transistor.

For example, a 7 nm thick silicon oxide SiO$_2$ is grown on the exposed parts of the substrate (called active areas) during the second step 602.

During a third step 603, the formation of the first conductive layer 613 of the capacitive element is simultaneously implemented with the formation of a floating gate 623 of the memory cell floating gate transistor.

For example, the third step 603 comprises depositing and etching doped polycrystalline silicon.

Similarly, only the mask from which the formation of the floating gate 623 of the memory cell is produced has to be adapted to implement the formation of the first conductive layer 613 of the capacitive element during the third common step 603.

During a fourth step 604, the formation of the second dielectric layer 614 of the capacitive element is simultaneously implemented with the formation of a high-voltage control gate dielectric 624 of a memory cell floating gate transistor.

For example, an "ONO" stack of silicon dioxide layers SiO$_2$, of silicon nitride Si$_3$N$_4$ and of silicon dioxide SiO$_2$ is formed on the first layer and on the floating gate during the fourth step 604.

During a fifth step 605, the formation of the second conductive layer 615 of the capacitive element is simultaneously implemented with the formation of a control gate 625 of the memory cell floating gate transistor.

For example, the fifth step 605 comprises depositing and etching doped polycrystalline silicon.

Similarly, only the mask from which the formation of the control gate 625 of the memory cell is produced has to be adapted to implement the formation of the second conductive layer 615 of the capacitive element during the fifth common step 605.

During a sixth step 606, the formation of the contacts 616 of the capacitive element is simultaneously implemented with the formation of contacts of the drain or source area type 626 of a memory cell floating gate transistor or of another part of the integrated circuit.

Indeed, for example, the second contact N+ of the capacitive element can be simultaneously formed with the source and drain areas with the second conductivity type of the floating gate transistor.

This being the case, another part of the integrated circuit, for example, a control logic part of memory cells, can comprise complementary constructions of the MOS type, and thus require contacts highly integrated both with the first conductivity type and with the second conductivity type.

The electrical connection of the second electrically conductive layer of the semiconductor well and the doped surface region forming the second electrode can be produced, for example, by electric contacts passing through the first interconnection levels (commonly denoted "FEOL" (Front End Of Line)).

Thus, an embodiment has been described of a method for manufacturing a capacitive element that only requires the adaptation of some masking steps of an embodiment of a method for manufacturing a memory cell comprising a floating gate transistor. The method is thus free in terms of manufacturing steps and of production cost when it is included in a method providing for the manufacture of such memory cells.

Furthermore, the invention is not limited to these embodiments and implementations but includes all the variations, with the numerical values of the features of the capacitive element being by no means limiting in the strictest sense, but indicating an order of magnitude, for example, at 10% of the given value, preferably at 5%. Furthermore, the method according to the invention, described with reference to FIG. 6, is clearly applicable without the simultaneous production of a memory cell.

The invention claimed is:

1. An integrated circuit, comprising:
    a semiconductor well doped with a first conductivity type; and
    at least one capacitive element, comprising:
        a first electrically conductive layer above the semiconductor well, the first electrically conductive layer forming a first capacitor electrode;
        a second electrically conductive layer above the first electrically conductive layer;
        a doped surface region located in the semiconductor well and at an upper surface of the semiconductor well, said doped surface region being heavily doped with a second conductivity type that is opposite the first conductivity type, the doped surface region located under the first electrically conductive layer; and
        an inter-electrode dielectric area separating the first electrically conductive layer from each of the second electrically conductive layer and the doped surface region;

wherein the second electrically conductive layer and doped surface region form a second capacitor electrode.

2. The integrated circuit according to claim 1, wherein said doped surface region extends over the upper surface of the well which faces the first electrically conductive layer.

3. The integrated circuit according to claim 1, wherein a thickness of said doped surface region is less than 10 nm.

4. The integrated circuit according to claim 1, wherein a thickness of said doped surface region is less than 5 nm.

5. The integrated circuit according to claim 1, wherein said inter-electrode dielectric area comprises a first dielectric layer between the first electrically conductive layer and the doped surface region, and a second dielectric layer between the first electrically conductive layer and the second electrically conductive layer.

6. The integrated circuit according to claim 1, wherein the capacitive element further comprises a first contact heavily doped with the first conductivity type electrically connecting the semiconductor well to the second electrode, and a second contact heavily doped with the second conductivity type electrically connecting the doped surface region to the second electrode.

7. The integrated circuit according to claim 1, wherein said at least one capacitive element forms one of: a decoupling capacitor, a compensation circuit or a radiofrequency signal filter capacitor.

8. An integrated circuit capacitor, comprising:
a semiconductor substrate doped with a first conductivity type;
a doped region located at an upper surface of the semiconductor substrate, said doped region being doped with a second conductivity type that is opposite the first conductivity type;
a first electrically conductive layer located above and insulated from the doped region of the semiconductor substrate;
a second electrically conductive layer located above and insulated from the first electrically conductive layer;
wherein the first electrically conductive layer forms a first electrode of the integrated circuit capacitor; and
wherein the second electrically conductive layer and the doped region form a second electrode of the integrated circuit capacitor.

9. The integrated circuit capacitor according to claim 8, further comprising:
a contact region in the semiconductor substrate that is doped with the first conductivity type; and
an electrical connection between the contact region and the second electrically conductive layer.

10. The integrated circuit capacitor according to claim 9, wherein the contact region is in contact with the doped region.

11. The integrated circuit capacitor according to claim 9, wherein a doping level of the contact region exceeds a doping level of the semiconductor substrate.

12. The integrated circuit capacitor according to claim 8, further comprising:
a contact region in the semiconductor substrate that is doped with the second conductivity type; and
an electrical connection between the contact region and the second electrically conductive layer.

13. The integrated circuit capacitor according to claim 12, wherein the contact region is in contact with the doped region.

14. The integrated circuit capacitor according to claim 12, wherein a doping level of the contact region exceeds a doping level of the doped region.

15. The integrated circuit capacitor according to claim 8, further comprising dielectric layers which insulate the first electrically conductive layer from the doped region of the semiconductor substrate and insulate the second electrically conductive layer from the first electrically conductive layer.

16. The integrated circuit capacitor according to claim 8, wherein a thickness of said doped region is less than 10 nm.

17. The integrated circuit capacitor according to claim 8, wherein a thickness of said doped region is less than 5 nm.

18. The integrated circuit capacitor according to claim 8, wherein said integrated circuit capacitor is one of: a decoupling capacitor, a compensation circuit or a radiofrequency signal filter capacitor.

* * * * *